United States Patent
Gao

(10) Patent No.: US 10,736,240 B2
(45) Date of Patent: Aug. 4, 2020

(54) HIGH RELIABILITY COOLING MODULE DESIGN FOR IT AND DATA CENTER LIQUID COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 15/989,053

(22) Filed: May 24, 2018

(65) Prior Publication Data

US 2019/0364699 A1 Nov. 28, 2019

(51) Int. Cl.
H05K 7/20 (2006.01)
G01M 3/40 (2006.01)

(52) U.S. Cl.
CPC .......... *H05K 7/20763* (2013.01); *G01M 3/40* (2013.01); *H05K 7/20254* (2013.01); *H05K 7/20272* (2013.01)

(58) Field of Classification Search
CPC ........... H05K 7/20763; H05K 7/20254; H05K 7/20272; H05K 7/20218; H05K 7/20536; H05K 7/20709; H05K 7/20636; H05K 7/20645; H05K 7/20772; H05K 7/20781; G01M 3/40; H01L 23/46; H01L 23/473; G06F 1/20; G06F 1/203; G06F 1/206
USPC .................................. 361/679.53, 699, 702
See application file for complete search history.

(56) References Cited

U.S. PATENT DOCUMENTS

| | | | | |
|---|---|---|---|---|
| 7,002,799 B2* | 2/2006 | Malone | .............. | H05K 7/20727 165/80.4 |
| 2002/0135981 A1* | 9/2002 | Pautsch | ............... | H01L 23/4735 361/700 |
| 2011/0247348 A1* | 10/2011 | Mashiko | .............. | H05K 7/2079 62/62 |
| 2013/0044434 A1* | 2/2013 | Sharaf | ................ | H05K 7/20927 361/702 |
| 2014/0020885 A1* | 1/2014 | Chainer | ............ | H05K 7/20836 165/287 |
| 2014/0085823 A1* | 3/2014 | Campbell | .......... | H05K 7/20236 361/701 |

(Continued)

*Primary Examiner* — Jayprakash N Gandhi
*Assistant Examiner* — Stephen S Sul
(74) *Attorney, Agent, or Firm* — Womble Bond Dickinson (US) LLP

(57) ABSTRACT

A cooling module including a module panel comprising a bottom panel with top and bottom surfaces and a set of sidewalls coupled to the entire perimeter of the bottom panel. The bottom panel has openings to receive liquid cooling elements. The liquid cooling elements are inserted into the openings; each has an inlet and an outlet and is positioned so that there is a gap between the edges of the cooling element and the edges of the opening. The inlets and outlets are positioned on the side of the cooling element above the top surface of the bottom panel. A flexible deviation buffer is positioned in each gap and is coupled to the liquid cooling element and to the opening. The deviation buffer allows motion of the cooling element relative to the bottom panel while sealing the gap to prevent liquid from flowing through. The cooling module can improve liquid cooling reliability through quick leakage identification, leakage impact minimization, and segregation of liquid and electronics.

12 Claims, 5 Drawing Sheets

(56) References Cited

U.S. PATENT DOCUMENTS

| | | | |
|---|---|---|---|
| 2014/0124164 A1* | 5/2014 | Campbell | F24T 10/30 |
| | | | 165/45 |
| 2016/0136851 A1* | 5/2016 | Campbell | H05K 7/20436 |
| | | | 264/279 |
| 2016/0165755 A1* | 6/2016 | Bodenweber | H01L 23/46 |
| | | | 165/80.2 |
| 2016/0345466 A1* | 11/2016 | Arvelo | H05K 7/20272 |
| 2017/0099725 A1* | 4/2017 | Maillet, Jr. | H05K 1/021 |
| 2017/0127549 A1* | 5/2017 | Lunsman | H05K 7/1489 |
| 2017/0177041 A1* | 6/2017 | Shelnutt | G06F 1/20 |
| 2017/0181329 A1* | 6/2017 | Shelnutt | H05K 7/20763 |
| 2018/0284852 A1* | 10/2018 | Rannow | G06F 1/20 |
| 2019/0200485 A1* | 6/2019 | Coteus | H01L 23/473 |

\* cited by examiner

HIGH RELIABILITY COOLING MODULE DESIGN FOR IT AND DATA CENTER LIQUID COOLING

TECHNICAL FIELD

The disclosed embodiments relate generally to cooling systems and in particular, but not exclusively, to a liquid cooling module for servers and data centers.

BACKGROUND

Liquid cooling can be a cost-effective thermal management solution, sometimes the only feasible solution, in some practical computing applications such as high-density servers/racks and high-performance compute (HPC) servers/racks. HPC, for instance, uses high performance processors such as CPU and GPU processors that generate a large amount of heat during operation. Thermal management for these high power density processors and servers thus becomes a challenge.

There are few attempts to solve this thermal management challenge. For liquid cooling solutions using a cold plate, most existing solutions are single cold plates with supply and return hoses assembled together. Assembling a single cooling element onto a processor is easy, but once there are multiple cooling elements assembled in a cooling loop, installing the cooling loop on the processors is very difficult and risky. If the cooling loop has multiple cooling elements, it can require multiple operators to work together to complete assembly, which increases cost and the probability of errors.

There is no mature or effective solution for solving this problem. In terms of leakage prevention, existing solutions focus on non-conductive working fluid, negative pressure system, and leak detection. But all these approaches inefficient.

BRIEF DESCRIPTION OF THE DRAWINGS

Non-limiting and non-exhaustive embodiments are described below with reference to the following figures, wherein like reference numerals refer to like parts throughout the various views unless otherwise specified.

FIG. 1A is a plan view, FIG. 1B a sectional view taken substantially along section line B-B in FIG. 1A, FIG. 1C an exploded view of a bottom panel, a flexible deviation buffer, and a cooling element.

FIG. 2A is a plan view, FIG. 2B a sectional view taken substantially along section line B-B in FIG. 2A.

FIG. 4A is an exploded view, FIGS. 4B-4C are assembled views.

DETAILED DESCRIPTION

Embodiments are described of an apparatus and system for liquid cooling in a data center. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

The disclosed embodiments focus on the problem of direct liquid cooling using liquid cooling elements such as cold plates, in which the cooling elements are attached to electronics components and heat is transferred to a working fluid circulating through these devices without using air. It is different from other types of liquid cooling solutions, for instance immersion cooling in which the electronics are immersed within the fluid; this type of direct liquid cooling is a more feasible solution for many use cases.

To design a liquid cooling solution which can be deployed at scale, a hardware design is needed for cases when multiple cooling elements are packaged in a server/IT. Assembly is easy when there is only one cooling element. But in many recent applications multiple processors are packaged close to each other within one server, meaning that multiple cooling elements are assembled into a single server cooling module to be used within one server. Additional components are needed for a cooling element, such as fluid distribution unit, hoses/liquid piping, leak detections, etc., meaning that solutions are needed for packaging these cooling elements and their additional components. Furthermore, reliability is an important challenge for liquid cooling. One of the most efficient methods for improving reliability is to segregate the liquid from the electronics; the disclosed embodiments provide a design that does this.

Figure 1A:
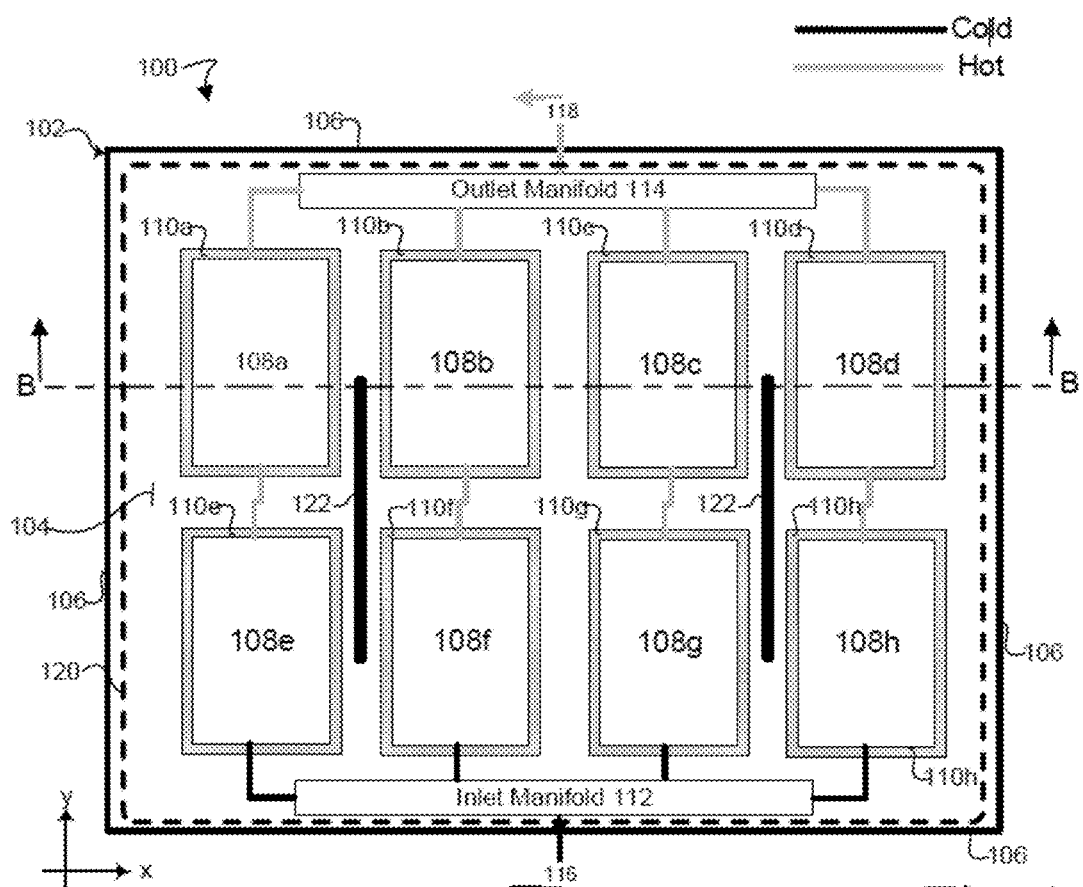
FIGS. 1A-1C are views of an embodiment of a server cooling module.
Figure 1B:
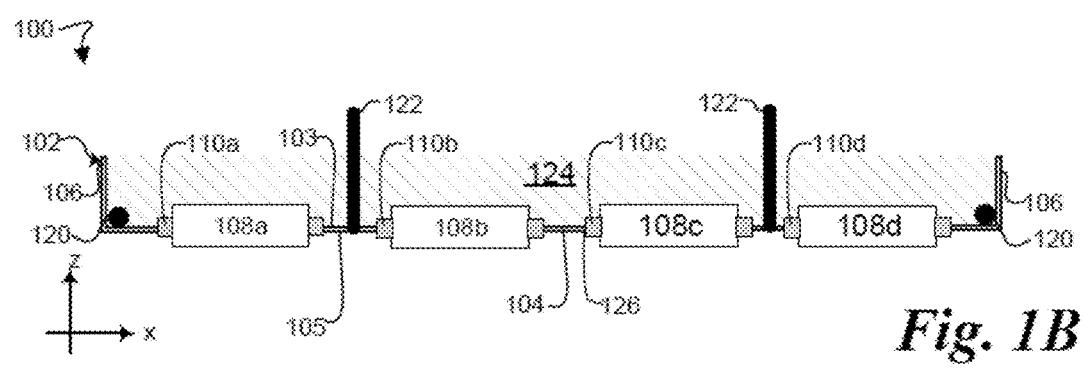

FIGS. 1A-1B illustrate an embodiment of a server cooling module 100; FIG. 1A is a plan view, FIG. 1B a cross-sectional view along section line B-B in FIG. 1A. Cooling module 100 includes a module panel 102 with one or more holes or openings therein, each opening sized to accommodate a corresponding liquid cooling element 108. The illustrated embodiment includes eight cooling elements 108a-108h, but the number of cooling elements 108 can be different in other embodiments; generally, the number of cooling elements 108 will match the number of computing elements to be cooled on the server to which cooling module 100 will be attached. A flexible deviation buffer 110 is positioned in the gap between the edges of each liquid cooling element 108 and the edges of its corresponding opening in module panel 102: thus, liquid cooling element 108a has a corresponding flexible deviation buffer 110a, liquid cooling element 108b has a corresponding flexible deviation buffer 110b, and so on. A leak detection wire 120 is positioned around the perimeter of module panel 102. An inlet manifold 112 and an outlet manifold are positioned on module panel 102. Handles 122 are attached to bottom panel 104 to allow easy handling of module 100.

In the illustrated embodiment liquid cooling elements 108e-108h have their inlets fluidly coupled to inlet manifold 112 and their outlets coupled to the inlets of liquid cooling elements 108a-108d. The outlets of liquid cooling elements 108a-108d are in turn fluidly coupled to outlet manifold 114. As used herein, "fluidly coupled" means coupled in such a way that fluid can be exchanged; thus, if two elements are fluidly coupled, fluid can flow in one or both directions between them. Inlet manifold 112 is fluidly coupled to a main facility supply line 116 that supplies cool working fluid to cooling module 100, while outlet manifold 114 is fluidly coupled to a main facility return line 118 that returns hot or warm working fluid to a heat exchanger elsewhere in a facility (see, e.g., FIG. 5). In other embodiments, however, the fluid connections between and among the fluid components in server cooling module 100—including cooling elements, hoses, connectors, manifolds, leak detection cables and devices, pumps, etc.—can be different than shown. For instance, other embodiments can omit inlet manifold 112 an outlet manifold 114 in favor of direct connection of liquid cooling elements 108a-108h to supply line 116 or return line 118. Still other embodiments can add additional components such as pumps.

Module panel 102 includes a planar bottom panel 104 with a top surface 103 and a bottom surface 105. In the context of this application, "top" or "bottom" refer to the particular orientation of module 100 shown in the drawing and are not intended to mandate a particular orientation or limit the orientation of cooling module 100 when in use. A set of sidewalls 106 is attached to bottom panel 104 along its entire perimeter. In the illustrated embodiment, sidewalls 106 project upward from top surface 103 and are substantially perpendicular to top surface 103 (i.e., at an angle of 90° relative to top surface 103), so that bottom panel 104, sidewalls 106, cooling elements 108, and flexible deviation buffers 110 form a volume 124, shown cross-hatched in the figure. In other embodiments sidewalls 106 can be arranged differently than shown, for instance by placing them at a location other than the perimeter of bottom panel 104 or angling them at other than 90° relative to bottom panel 104.

Figure 1C:
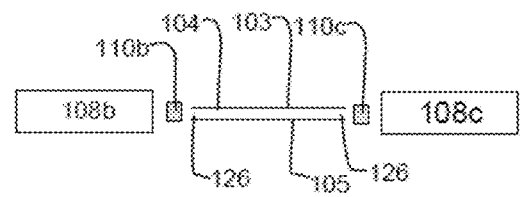

As illustrated in FIG. 1C, bottom panel 104 includes openings or holes 126 that extend through the entire thickness of bottom panel 104, from top surface 103 to bottom surface 105, to receive cooling elements 108. The openings 126 in bottom panel 104 are sized and shape to receive a corresponding cooling element 108 while leaving a gap between the edges of the opening 126 and the edges of the corresponding cooling element 108. Each gap will then accommodate a corresponding flexible deviation buffer 110. The illustrated embodiment has eight cooling elements 108a-108h positioned in bottom panel 104, each with a corresponding flexible deviation buffer 110a-110h, but other embodiments can have a different number of cooling elements. Moreover, in the illustrated embodiment cooling elements 108 are positioned in bottom panel 104 in a regular grid, but in other embodiments that need not be the case; generally, the positions of cooling element 108 will substantially match the positions on the server of the computing elements to which the cooling elements will be thermally coupled (see, e.g., FIGS. 4A-4C). In one embodiment, module panel 102 can be formed of stamped sheet metal, but in other embodiments it can be formed of different materials or different using different techniques, such as formed plastic.

Figure 4A:
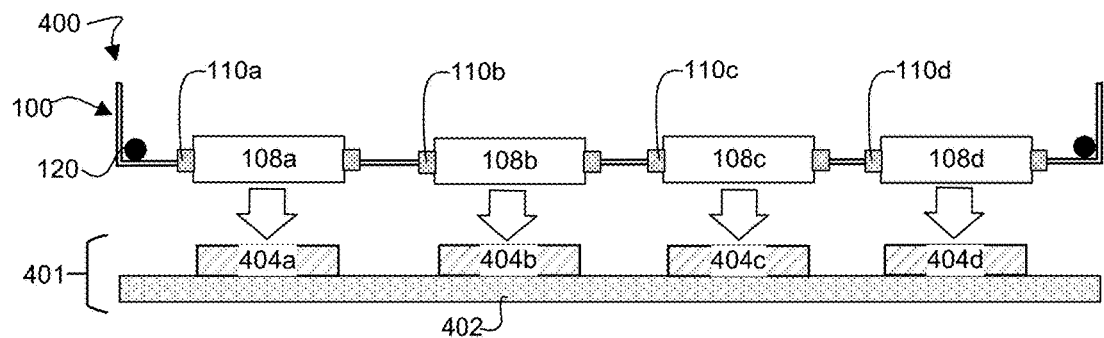
FIGS. 4A-4C are cross-sectional drawings of embodiments of a server including a server cooling module such as the one shown in FIGS. 1A-1B.
Figure 4B:
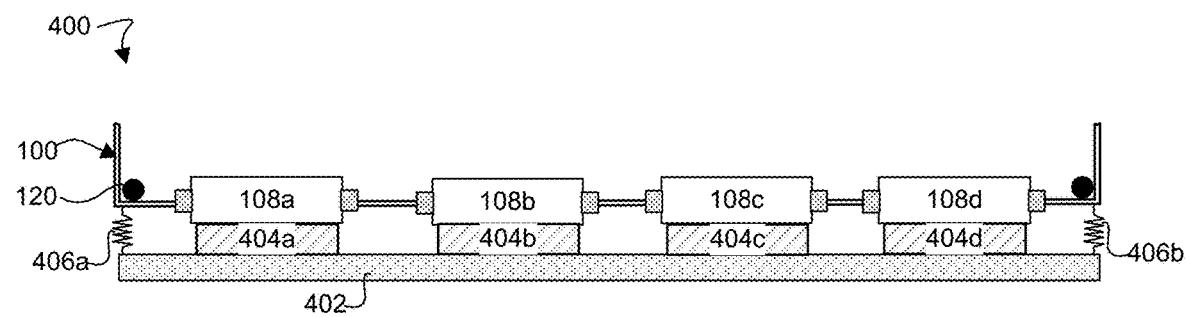
Figure 4C:
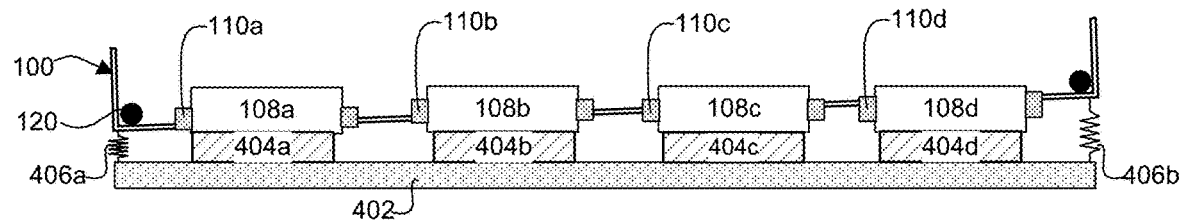

Liquid cooling elements 108 are designed to extract heat from server computing elements to which they will be thermally coupled (see, e.g., FIGS. 4A-4C). In one embodiment cooling elements 108 can be cold plates, but in other embodiments they can be another type of liquid cooling element. Moreover, in other embodiments not every cooling element 108 need be of the same kind: in some embodiments all cooling elements 108a-108h can be of the same type, but in other embodiments cooling elements 108a-108h can be of two or more different types. Cooling elements 108 are sized and positioned within module panel 102 so that they substantially match the sizes and positions of underlying computing elements with which the cooling elements will be 108 will be put in thermal contact. Each cooling element 108 includes a liquid inlet and a liquid outlet, and the inlet and outlet of each cooling element 108 in cooling module 100 are positioned above top surface 103, within volume 124. The cooling module segregates the electronics component and the cooling components: all cooling elements are assembled on top, and the electronic elements are underneath the cooling module. This segregation prevents liquid from coming in contact with the electronics in a leakage scenario while keeping entire cooling module thermally coupled with the electronic elements such as processors. The heat transfer pads/bases of the cooling elements/cooling modules will have a direct contact with the processors, in some cases using thermal interface materials.

Each flexible deviation buffer 110 fills and seals the gap between the opening in bottom panel 104 and its corresponding cooling element 108; basically, each buffer 110 provides the connection between the cooling element and the module panel. Each flexible deviation buffer 110 positioned along the perimeter of its corresponding cooling element 108: liquid cooling element 108a has flexible deviation buffer 110a, liquid cooling element 108b has flexible deviation buffer 110b, and so on. In the illustrated embodiment all flexible deviation buffers 110a-110h are the same, but in other embodiments not every liquid cooling element 108 need use the same kind of flexible deviation buffer 110. Because they are flexible, deviation buffers 110 allow motion of their corresponding liquid cooling element 108 relative to bottom panel 104. In other words, flexible deviation buffers 110 permit cooling elements 108 to translate in the x, y, and z directions relative to bottom panel 104, as well as allowing cooling elements 108 to rotate about all three axes relative to bottom panel 104. Flexible deviation buffers 110 are also waterproof, so that they seal the gap between each opening in bottom panel 104 and the edges of its corresponding liquid cooling element 108. By sealing the gap between liquid cooling elements 108 and the edges of their corresponding openings, flexible deviation buffers 110 prevent leaking liquid from running through to the server and its electronics components, instead capturing the leaking liquid in volume 122. In various embodiments, flexible deviation buffers 110 can be made of different materials, such as rubber or silicon, and can take various forms (see, e.g., FIGS. 3A-3B).

Each flexible deviation buffer 110 has multiple functions. First, each cooling element 108 will need to be attached to individual computing element, but the relative locations of the cooling elements may not exactly match the ones of the processors, therefore, the deviation buffer provides a larger position tolerance. Second, each flexible deviation buffer flexible uses watertight materials to provide a better fluid leak prevention compared with direct connections. Third, the flexible deviation buffer allows individual cooling elements 108 to be easily removed and/or replaced in the module. Fourth, the flexible deviation buffers provide vertical position tolerance and mounting pressure for the cooling elements. Finally, the buffers enable the cooling module panel to be designed inclined to directing leaking fluid.

A leak detection wire 120 is positioned around the perimeter of module panel 102 so that it can detect any fluid accumulating in volume 124 as a result of fluid leaks in any of liquid cooling elements 108, their respective inlets or outlets, or the fluid connections of the liquid cooling elements.

In this design, once there is a leak, the fluid will only be flowing within the cooling module. The cooling module is fully sealed and there will be no contact between liquid and electronics. In addition, the cooling module functions as a liquid tank to contain certain amount of the fluid after the leakage occurs. In addition, as it mentioned in the previous sections, leak detection module/cable/function can be added to the cooling module, so that leaks can be stopped before volume 124 is fully filled. In addition, the cooling module design provides a hardware solution for server liquid cooling, especially in the cases multiple processors which are liquid cooled are packaged in a server. Different server layouts may require a slightly change on the cooling module design, such as: a different server or GPU box may have different numbers of processors, or the layout of the processors on the motherboard may be different; the mechanical design of the cooling module maybe different due to different chassis form factors; different server liquid distribution manifolds may be applied on the panel, or the liquid piping, inlet/outlet connectors may require different design of the cooling module; different cooling elements or cooling unit designs may require minor changes on the cooling panel; different designs may be used for mounting or locking the cooling module onto the chassis; and server inlet and outlet quick disconnects maybe assembled on the module, which may require some mechanical design.

Figure 2A:
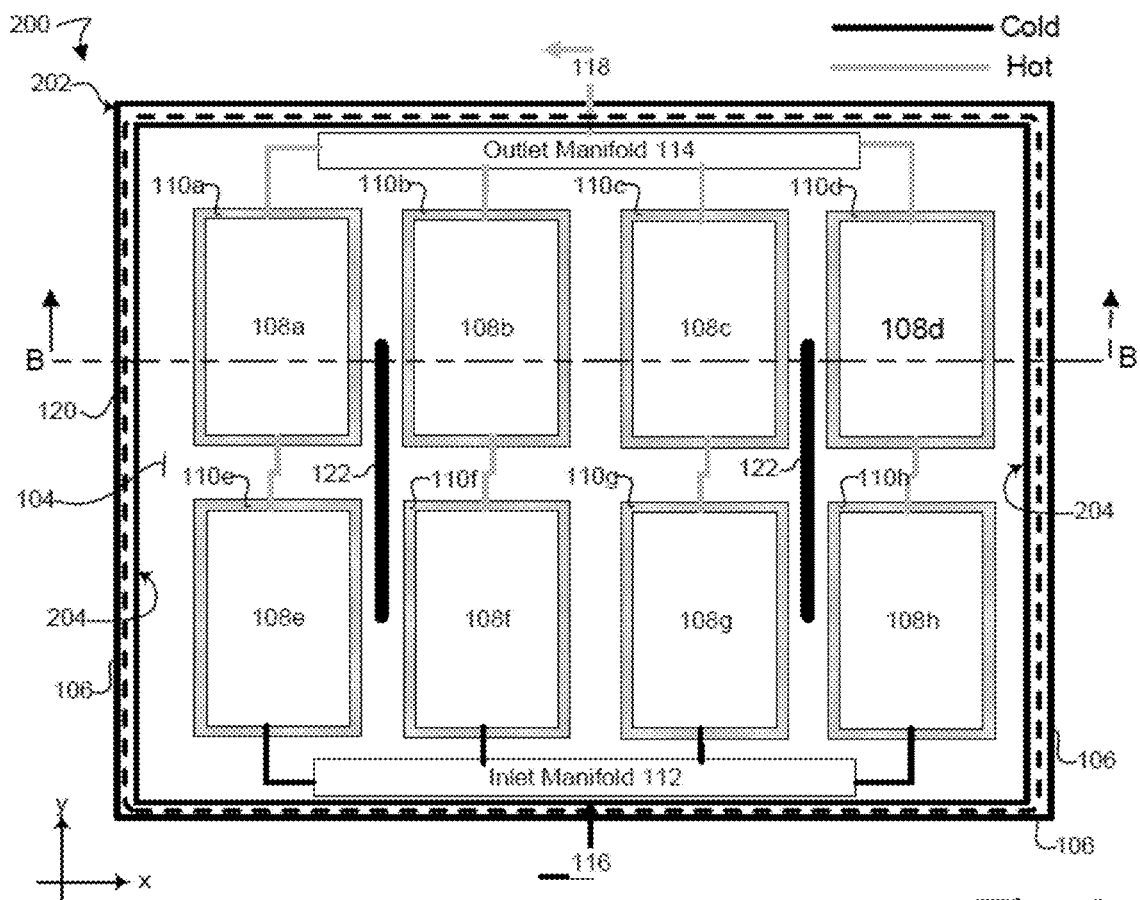
FIGS. 2A-2B are views of another embodiment of a server cooling module.
Figure 2B:
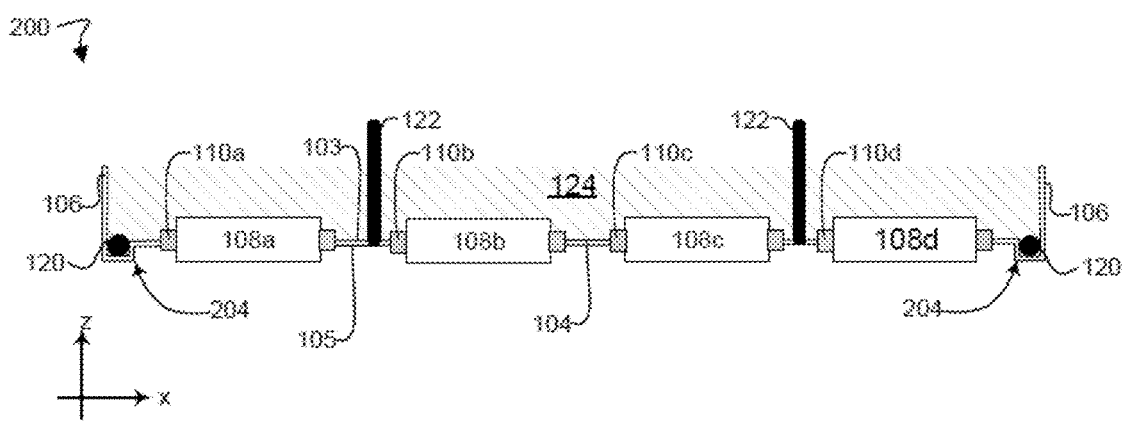

FIGS. 2A-2B illustrate another embodiment of a liquid cooling module 200. Liquid cooling module 200 is similar in most respects to liquid cooling module 100: it includes bottom panel 104, sidewalls 106, cooling elements 108, flexible deviation buffers 110, manifolds 112 and 114, leak detection wire 120, etc. The primary difference between liquid cooling modules 200 and 100 is that liquid cooling module 200 includes a notch 204 formed around the perimeter of bottom panel 104. Leak detection wire 120 is then positioned in notch 204. Notch 204 provides a low point in module panel 102, so that any liquid accumulating in volume 124 as a result of leaks will quickly run, under the influence of gravity, into notch 204 where it can be more easily detected by leak detection wire 120. This embodiment allows faster identification of leaks and, can allow the length and amount of leak detection cable to be significantly decreased.

Figure 3A:
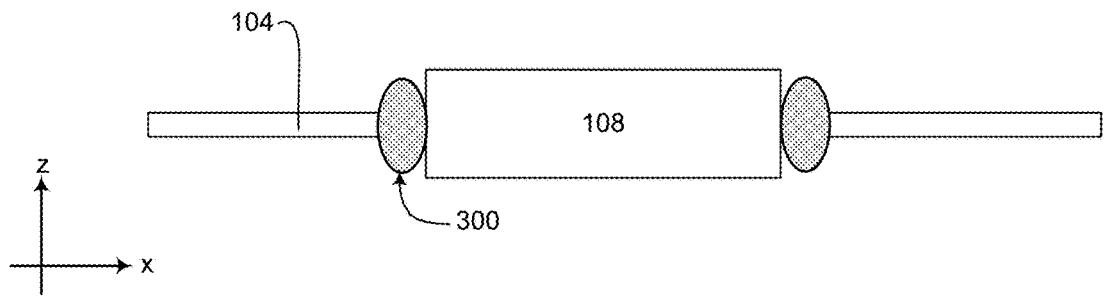
FIGS. 3A-3B are cross-sectional views of embodiments of flexible deviation buffers.
Figure 3B:
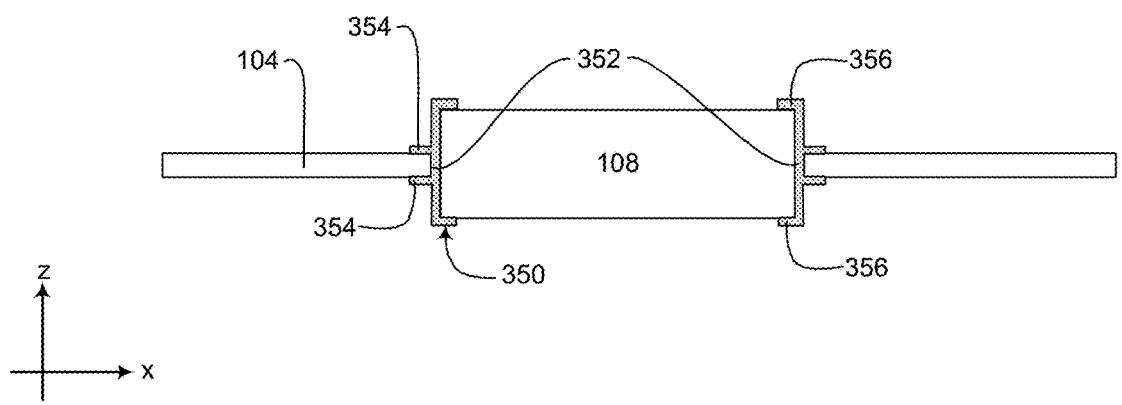

FIGS. 3A-3B illustrate embodiments of flexible deviation buffers that can be used to seal the gap between each opening in bottom panel 104 and its corresponding liquid cooling element 108. FIG. 3A illustrates a flexible deviation buffer 300 that is an O-ring. In the illustrated embodiment O-ring 300 has an elliptical cross-section, but in other embodiments ring 300 can have other cross-sections, such as a round or polygonal cross-section. Moreover, the shape of O-ring 300 can be different when installed than when uninstalled: for instance, if an O-ring with a round cross-section is compressed when it is inserted into the gap between the edges of the opening and the corresponding liquid cooling module 108, its cross-section can become elliptical. In one embodiment, O-ring 300 is a single piece O-ring that wraps all the way around the perimeter of liquid cooling module 108, but in other embodiments it can be a multi-piece O-ring.

FIG. 3B illustrates another embodiment of a flexible deviation buffer 350. Flexible deviation buffer 350 includes a central portion 352. Two spaced-apart extensions 354 extend in one direction from one side of central portion 352, while two spaced-apart extensions 356 extend in the opposite direction from the opposite side of central portion 352. When rotated 90 degrees from the illustrated orientation, flexible deviation buffer 350 looks like a letter H, depending on the relative thicknesses of bottom panel 104 and cooling element 108. In the illustrated embodiment cooling element 108 is substantially thicker than bottom panel 104, so that buffer 350 looks like an H with one side of the H wider than the other. In other embodiments, however, cooling element 108 can have a thickness closer to the thickness of bottom panel 104, such that buffer 350 looks like a regularly-proportioned H.

FIGS. 4A-4C illustrate embodiments of an assembly 400 including a server 401 together with a liquid cooling module. The illustrated embodiments use cooling module 100 is an example, but in other embodiments liquid cooling module 200 could be used instead of cooling module 100. FIGS. 4A-4B illustrate an exploded view and an assembled view of an assembly 400 in which a cooling module 100 is installed on a server 401. In assembly 400, server 401 includes a substrate 402 on which are mounted a plurality of computing elements 404; the illustrated embodiment has four computing elements 404a-404d, but other embodiments can include more or less computing elements than shown. Computing elements 404 can include microprocessors, graphics processors, memories, and other such components. The number of liquid cooling elements 108 in cooling module 100 substantially matches the number of computing elements 404. To begin assembly, liquid cooling module 100 is lowered onto the server so that each of liquid cooling elements 108a-108h is put in thermal contact with a corresponding computing element 404: cooling element 108a is put in thermal contact with computing element 404a, cooling element 108b is put in thermal contact with computing element 404b, and so on. The bases of cooling elements 108 should be fully in contact with computing elements 404 to enable the cooling elements to function properly; without proper contact, the cooling element might fail or might not function as designed. To enhance thermal contact between computing elements 404 and liquid cooling elements 108, a thermal interface material (TIM) (not shown) can be inserted or dispensed between them.

FIG. 4B illustrates assembly 400 once cooling module 100 is in place. When cooling module 100 has been positioned so that all liquid cooling elements 108 are thermally coupled to their corresponding computing element 404, a set of springs 406 can be attached to substrate 402 and module panel 102 to hold cooling module 100 in position on the server. In the illustrated embodiment, the set of springs includes two springs 406a-406b, but other embodiments can include a different number of springs than shown. Springs 406a-406b help initial assembly of the cooling module to the server by providing a flexible physical support; when multiple cooling units are used in a single cooling module, it is difficult to assemble all the cooling module exactly onto the corresponding processors.

FIG. 4C illustrates an embodiment in which springs 406a and 406b apply different forces on different parts of cooling module 100. As a result of applying uneven forces to cooling module 100, cooling module 100 ends up positioned with bottom panel 104 not parallel to substrate 402, but at an angle relative to substrate 402. This can be accomplished, for instance, by using springs 406a and 406b of different types or springs that have a different spring constants k. By positioning bottom panel 104 at an angle relative to substrate 402, gravity quickly and automatically directs any leaked fluid—from cooling elements 108, from their respective inlets or outlets, from the fluid connections between them, from the inlet and outlet manifold (see, e.g., FIGS. 1A-1B and 2A-2B), or from some other source—to the lower side of cooling module 100 where detection wire 120 is located. The result is that detection of fluid by leak detection wire 120 is made faster than it would be otherwise. As discussed above, flexible deviation buffers 110 permit linear and rotational motion of cooling elements 108 relative to bottom panel 104. The result of this flexibility is that, despite bottom panel 104's angle relative to substrate 102, each cooling element 108 remains fully and firmly in thermal contact with its corresponding computing element 404.

Figure 5:
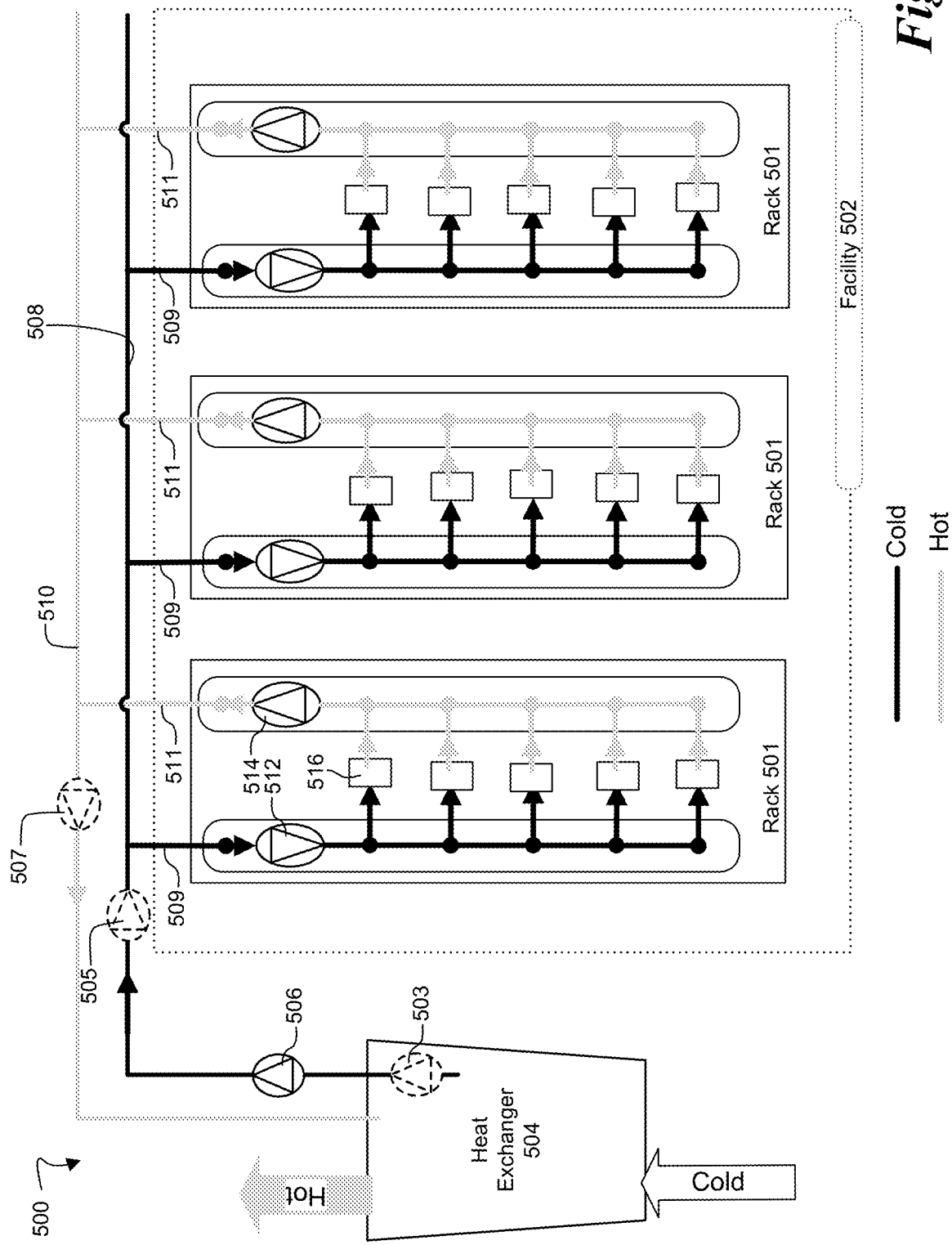
FIG. 5 is a schematic drawing of an embodiment of a data center cooling system including server racks with servers cooled by server cooling modules such as the ones shown in FIGS. 1A-1B and FIGS. 2A-2B.

FIG. 5 illustrates an embodiment of a data center cooling system 500. In cooling system 500, a plurality of server racks 501 are positioned inside a facility 502. Facility 502 can be a complete building, a subset of a building (e.g., a room or compartment within a building), or some other type of enclosure. A heat exchanger 504 is positioned outside facility 502. In the illustrated embodiment heat exchanger 504 is a liquid-to-atmosphere heat exchanger that transfers heat from the working liquid that circulates through server racks 501 into the atmosphere. But in other embodiments heat exchanger 504 can be a different type of heat exchanger, for instance a liquid-to-liquid heat exchanger. In embodiments in which heat exchanger 504 is a liquid-to-liquid heat exchanger, a natural water resource such as sea water or lake water can be used by the heat exchanger. In embodiments in which heat exchanger 504 is liquid-to-air heat exchanger, heat exchanger 504 can be a dry cooler, a cooling tower or an evaporative cooler.

Facility pump 506 has its inlet coupled to the liquid outlet of heat exchanger 504 and has its outlet coupled to facility supply line 508. A main supply line 509 for each server rack 501 is then coupled to facility supply line 508. Facility return line 510 is coupled to a main return line 511 of each server rack 501 and is also coupled to the liquid inlet of heat exchanger 504. Different data center infrastructures may require a slight modification on the facility liquid piping, but in any event cooling system 500 is a single-loop cooling system.

In various embodiments, facility pump 506 can be either packaged within heat exchanger 504 or designed as an external component. In the figure, facility pumps 503, 505, and 507, shown in dashed lines to indicate that they are optional, illustrate locations where facility pumps can be put instead of, or in addition to, pump 506. For instance, in some embodiments a facility pump 505 can be positioned in facility supply line 508 and/or a facility pump 507 can be positioned in facility return line 510. In other embodiments a facility pump 503 can be positioned within heat exchanger 504. Still other embodiments can have multiple facility pumps for redundancy or high flow rate or high-pressure requirements. Additional supply pumps 512 and return pumps 514 can be positioned in each rack 501. Basically, the facility pump provides major driving force for the fluid flowing in the system, and the rack pumps can provide additional driving force and control the amount of flow rate based on the rack heat load. Different control strategies for the facility pump and manifold pump can be developed.

In operation, facility pump 506 pumps cool working fluid from heat exchanger 504 into facility supply line 508, which then supplies the cool working fluid to the main supply line 509 of each server rack 501. The rack supply pump 512, if present, pumps cool working fluid into the sub-loop supply lines, which then deliver the cool working fluid to the cooling modules 516, which in different embodiment can me cooling modules 100 or 200. As the working fluid circulates through cooling modules 516, it absorbs heat and becomes hotter so that hot working fluid emerges through sub-loop return lines and into the outlet manifold. The rack return pump 514, if present, then pumps the hot working fluid into facility return line 510, which returns the hot working fluid to heat exchanger 504. As the hot working fluid circulates through heat exchanger 504 cool air, for instance from the atmosphere, circulates through heat exchanger 504 and removes heat from the hot working fluid, so that it can again be circulated through the server racks 501 by facility pump 506.

The disclosed embodiments provide high reliability liquid cooling modules for IT and data centers. The concept introduced in this invention provides a hardware solution and device for liquid cooling, especially in the cases there are multiple processors or components are designed for liquid cooling. In addition, the disclosed embodiments segregate the electronics and liquid. This significantly decreases in the impact of liquid leakage, and entire system reliability. Some advantages of the disclosed embodiments are:

High reliability:
  The cooling module design provides a segregation of the liquid and electronics, also provides a segregation of the cooling module and electronics, only providing the necessary heat transfer contact between the two.
  The cooling module provides a mean for containing and guiding the leaked liquid, preventing liquid flowing anywhere.
  The design enables efficient embedding of leak detection on the module.
Modular design:
  This concept is a modular design, making it easy to assemble.
  Easy to maintain.
  Fast assembly; eliminates the difficulties of assembling multiple cooling elements and cooling loops in a server.
  Fast deployment.
  Low mechanical failure rate.
  Flexible solution for different types of IT layouts.
Multiple function:
  Manifold can be installed on the module.
  Leak detection can be installed on the module.
  Fluid guiding design (i.e., fluid connections) can be considered on the module without changing any server requirements.
  Additional pump can be installed on the module.

The above description of embodiments is not intended to be exhaustive or to limit the invention to the described forms. Specific embodiments of, and examples for, the invention are described herein for illustrative purposes, but various modifications are possible.

What is claimed is:

1. A cooling module comprising:
   a module panel comprising a bottom panel having a top surface, a bottom surface, and a set of sidewalls coupled to an entire perimeter of the bottom panel, the bottom panel having one or more openings therein that extend from the top surface to the bottom surface;
   one or more liquid cooling elements, each having an inlet and an outlet and each positioned in a corresponding one of the one or more openings in the bottom panel so that there is a gap between edges of the one or more liquid cooling elements and edges of the opening, wherein the inlet and the outlet of each of the one or more liquid cooling elements are positioned on a side of the one or more liquid cooling elements above the top surface of the bottom panel;

a flexible deviation buffer positioned in each gap and coupled to the one or more liquid cooling elements and to the opening, wherein the flexible deviation buffer allows motion of the one or more liquid cooling elements relative to the bottom panel while sealing the gap to prevent liquid from flowing through the gap; and an inlet manifold positioned on the top surface and an outlet manifold positioned on the top surface, the inlet manifold being fluidly coupled to the inlet of each of the one or more liquid cooling elements and the outlet manifold being coupled to the outlet of each of the one or more liquid cooling elements.

2. The liquid cooling module of claim 1, wherein the deviation buffer is an O-ring.

3. The liquid cooling module of claim 1, further comprising a leak detection wire positioned around at least part of a perimeter of the module panel.

4. The liquid cooling module of claim 1, wherein the one or more liquid cooling elements are cold plates.

5. A liquid-cooled server comprising:
a server including one or more computing elements mounted on a substrate;
a cooling module coupled to the server, the cooling module comprising:
a module panel comprising a bottom panel having a top surface, a bottom surface, and a set of sidewalls coupled to an entire perimeter of the bottom panel, the bottom panel having one or more openings therein that extend from the top surface to the bottom surface,
one or more liquid cooling elements, each having an inlet and an outlet and each positioned in a corresponding one of the one or more openings in the bottom panel so that there is a gap between edges of the one or more liquid cooling elements and edges of the opening, wherein the inlet and the outlet of each of the one or more liquid cooling elements are positioned on a side of the one or more liquid cooling elements that is on the top surface of the bottom panel,
a flexible deviation buffer positioned in each gap and coupled to the one or more liquid cooling elements and to the opening, wherein the flexible deviation buffer allows motion of the one or more liquid cooling elements relative to the bottom panel while sealing the gap to prevent liquid from flowing through the gap,
an inlet manifold positioned on the top surface and an outlet manifold positioned on the top surface, wherein the inlet manifold is fluidly coupled to the inlet of each of the one or more liquid cooling elements and the outlet manifold is coupled to the outlet of each of the one or more liquid cooling elements; and
a set of springs coupled to the substrate and to the cooling module, wherein the set of springs pull each of the one or more liquid cooling elements into thermal contact with a corresponding computing element.

6. The server of claim 5 wherein the deviation buffer is an O-ring.

7. The server of claim 5, further comprising a leak detection wire positioned around at least part of a perimeter of the module panel.

8. The server of claim 5 wherein at least one of the set of springs exerts a different force on the cooling module than other springs in the set of springs, so that the bottom panel is tilted relative to a plane of the substrate.

9. A data center comprising:
a facility;
a plurality of server racks positioned within the facility, each server rack including:
a rack housing therein one or more servers, each server including one or more computing elements mounted on a substrate;
a cooling module coupled to each server, the cooling module comprising:
a module panel comprising a bottom panel having a top surface, a bottom surface, and a set of sidewalls coupled to an entire perimeter of the bottom panel, the bottom panel having one or more openings therein that extend from the top surface to the bottom surface,
one or more liquid cooling elements, each having an inlet and an outlet and each positioned in a corresponding one of the one or more openings in the bottom panel so that there is a gap between edges of the one or more liquid cooling elements and edges of the opening, wherein the inlet and the outlet of each of the one or more liquid cooling elements are positioned on the side of the one or more liquid cooling elements that is on the top surface of the bottom panel,
a flexible deviation buffer positioned in each gap and coupled to the one or more liquid cooling elements and to the opening, wherein the flexible deviation buffer allows motion of the one or more liquid cooling elements relative to the bottom panel while sealing the gap to prevent liquid from flowing through the gap, and
an inlet manifold positioned on the top surface and an outlet manifold positioned on the top surface, wherein the inlet manifold is fluidly coupled to the facility supply line and the inlet of each of the one or more liquid cooling elements, and wherein the outlet manifold is coupled to the facility return line and the outlet of each of the one or more liquid cooling elements;
a set of springs coupled to the substrate and to the cooling module, wherein the set of springs pull each of the one or more liquid cooling elements into thermal contact with a corresponding computing element;
a facility supply line coupled to each inlet of each liquid cooling element;
a facility return line coupled to each outlet of each liquid cooling element;
a heat exchanger positioned outside the facility and coupled to the facility supply line and the facility return line; and
a facility pump coupled in the facility supply line.

10. The data center of claim 9, further comprising a leak detection wire positioned around at least part of a perimeter of the module panel.

11. The data center of claim 10, wherein at least one of the set of springs exerts a different force on the cooling module than other springs in the set of springs, so that the bottom panel is tilted relative to a plane of the substrate.

12. The data center of claim 9, wherein the deviation buffer is an O-ring.

* * * * *